(12) United States Patent
Usami

(10) Patent No.: US 6,194,775 B1
(45) Date of Patent: Feb. 27, 2001

(54) SEMICONDUCTOR ELEMENT WITH THERMALLY NITRIDED FILM ON HIGH RESISTANCE FILM AND METHOD OF MANUFACTURING THE SAME

(75) Inventor: Tatsuya Usami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/007,155

(22) Filed: Jan. 14, 1998

(30) Foreign Application Priority Data

Jan. 16, 1997 (JP) .................................................. 9-005374

(51) Int. Cl.$^7$ .................................................. H01L 29/86
(52) U.S. Cl. ...................... 257/536; 257/393; 257/649; 257/904
(58) Field of Search .......................... 257/393, 903, 257/904, 536, 537, 538, 649

(56) References Cited

U.S. PATENT DOCUMENTS

| | | | | |
|---|---|---|---|---|
| 5,323,045 | * | 6/1994 | Murai | 257/904 |
| 5,751,050 | * | 5/1998 | Ishikawa et al. | 257/538 |

FOREIGN PATENT DOCUMENTS

| | | |
|---|---|---|
| 54-23379 | 2/1979 | (JP) . |
| 58-14560 | 1/1983 | (JP) . |
| 61-228661 | 10/1986 | (JP) . |
| 1-152733 | 6/1989 | (JP) . |
| 1-160024 | 6/1989 | (JP) . |
| 5-16186 | 3/1993 | (JP) . |
| 5-198744 | 8/1993 | (JP) . |
| 6-91189 | 11/1994 | (JP) . |
| 7-111261 | 4/1995 | (JP) . |
| 7-307293 | 11/1995 | (JP) . |
| 7-316823 | 12/1995 | (JP) . |
| 9-162307 | 6/1997 | (JP) . |

OTHER PUBLICATIONS

Japanese Office Action issued Sep. 14, 1999 in a related application.
English translation of relevant portions of Sep. 14, 1999 Japanese Office Action.

\* cited by examiner

*Primary Examiner*—David Hardy

(57) ABSTRACT

In a method of manufacturing a semiconductor device, an insulating film is formed on a semiconductor substrate. A semiconductor film pattern is formed on the insulating film. A direct thermal nitriding method is performed to at least a portion of the semiconductor film pattern. The direct thermal nitriding method is performed by lamp annealing in a gas composed of nitrogen such that a thermally nitrided film has a film thickness of equal to or thicker than 1.5 nm. Thus, invasion of a hydrogen atom or ion into the semiconductor film pattern can be prevented.

5 Claims, 6 Drawing Sheets

SEMICONDUCTOR ELEMENT WITH THERMALLY NITRIDED FILM ON HIGH RESISTANCE FILM AND METHOD OF MANUFACTURING THE SAME

BACKGROUND OF THE INVENTION

1. Field of the Invention

The present invention relates to a semiconductor device and a method of manufacturing the same, and more particularly, to a semiconductor device with a thermally nitrided film on a high resistance film and a method of manufacturing the same.

2. Description of the Related Art

The fine patterning and high performance of a semiconductor device have still vigorously been developed. At present, a super high integration semiconductor device such as memory device and logic device has been developed to meet the design rule of 0.15 to 0.25 $\mu$m.

In conjunction with such fine patterning and high performance of the semiconductor element, a fine multilayer wiring layer is indispensable to form a semiconductor device. For this purpose, the flat and smooth surface of an interlayer insulating film between the wiring layers is strongly required. Therefore, various insulating materials have been used for the interlayer insulating film. Also, the increase of film forming speed of such an interlayer insulating film also becomes important for the reduction of manufacturing cost of the semiconductor device.

A semiconductor device with a high resistance layer, for example, an SRAM is conventionally known in which the resistance value of the high resistance layer should be precisely controlled. In the progress of manufacturing technique of the semiconductor device, the resistance value is likely to fluctuate. This is because unnecessary impurities are easily introduced from the interlayer insulating film into the high resistance layer.

As conventional techniques to solve the above problems, there are known the technique disclosed in Japanese Examined Patent Disclosure (JP-B-5-16186: hereinafter, to be referred to as a first conventional example) and the technique disclosed in Japanese Examined Patent Disclosure (JP-B-6-91189: hereinafter, to be referred to as a second conventional example).

The techniques described in the above first conventional example of a manufacturing method of the semiconductor device will now be described with reference to the drawings. FIGS. 1A to 1E are cross sectional views of a semiconductor device in an order of the manufacturing process.

As shown in FIG. 1A, a field oxide ($SiO_2$) film 102 and a gate oxide ($SiO_2$) film 103 are formed in predetermined regions on a P-type single crystal Si substrate 101. Polysilicon layers 104 and 104a are formed on the films 102 and 103, respectively. A gate electrode of an MOS transistor is formed from the polysilicon layer 104a on the gate oxide film 103. Subsequently, the surfaces of the polysilicon layers 104 and 104a are thermally oxidized and a thermal oxidation film 105 is formed. An $Si_3N_4$ film 106 is formed on the thermal oxidation film 105.

Next, as shown in FIG. 1B, a silicon oxide film is deposited on the whole surface of the $Si_3N_4$ film 106 by a chemical vapor deposition (CVD) method, and unnecessary portions are removed by etching such that a mask insulating layer 107 is formed. Subsequently, ion implantation of phosphorus impurities or the like and heat treatment are executed to form $N^+$ diffusion layers 108 and 109 and an $N^+$ gate electrode 104a. The $N^+$ diffusion layer 108 functions as a source or drain region of the MOS transistor. In these processes, a high resistance portion 110 is formed in the polysilicon layer 104. Also, a high density impurity is implanted into the polysilicon layer 104a functioning as a gate electrode.

Next, as shown in FIG. 1C, the $Si_3N_4$ film 106 is removed such that an $Si_3N_4$ film 106a is left under the mask insulating layer 107.

Next, as shown in FIG. 1D, a PSG film 111 is deposited to cover the whole surface of the thermal oxidation film 105, the mask insulating film 107 and the like and is smoothed. Subsequently, contact holes are formed through the insulating films laminated on the $N^+$ diffusion layers 108 and 109. An Al wiring 112 which is connected to the $N^+$ diffusion layers 108 and 109 and another Al wiring 113 which is connected to the other $N^+$ diffusion layer 109 are formed, respectively.

As mentioned above, an MOS transistor is formed on the surface of the P-type Si single crystal substrate 101 and a high resistance layer composed of electrode portions of the $N^+$ diffusion layers 109 and the high resistance portion 110 are formed on the field oxide film 102. The high resistance layer is used as a load resistor element.

Next, as shown in FIG. 1E, an interlayer insulating film 114 which covers the Al wirings 112 and 113 and the like is formed. Finally, the N+ diffusion layers 109 function as electrode portions of the load resistor element. The surface of the high resistance portion 110 is covered by the thermally oxidized silicon film 105 and the $Si_3N_4$ film 106a.

The $Si_3N_4$ film 106a prevents the phosphorus impurities from being diffused from the PSG film 111 into the high resistance portion 110 so that the resistance value of the high resistance layer is fluctuated.

Next, the second conventional example of the manufacturing method of a semiconductor device will now be described with reference to FIGS. 2A to 2D. FIGS. 2A to 2D are cross sectional views of the semiconductor device in the order of the manufacturing method.

Next, as shown in FIG. 2A, element isolation oxide films 202 are formed on the surface of a P-type silicon semiconductor substrate 201. Subsequently, a gate oxide film 203 is formed. Then, a gate electrode 204 is formed of polysilicon or the like. Subsequently, N-type impurity ions such as phosphorus impurities or the like are implanted and are thermally treated, so that source and drain diffusion layers 205 are formed. At the same time, a gate electrode 204 is also formed. Thereafter, a silicon oxide film 206 is deposited to cover the whole surface.

Next, as shown in FIG. 2B, a BPSG film 207 is deposited on the silicon oxide film 206 and is thermally treated, thereby the surface is flattened.

Next, as shown in FIG. 2C, a first silicon nitride film 208 is formed on the BPSG film 207. This first silicon nitride film is deposited by the CVD method to have the film thickness of 100 nm to 200 nm. A high resistance layer 209 is formed on the first silicon nitride film 208. The high resistance layer 209 is formed of a semiconductor thin film of silicon or the like. subsequently, a second silicon nitride film 210 is deposited on the whole surface by the CVD method.

Next, as shown in FIG. 2D, an interlayer insulating film 211 is formed. Then, contact holes are formed through the interlayer insulating film 211, the second silicon nitride film 210, the first silicon nitride film 208, BPSG film 207, the silicon oxide film 206, and the gate oxide film 203 by a photolithography technique and a dry etching technique. Wirings 212 are formed by filling the contact holes with conductive material.

Finally, a passivation film 213 is formed to cover the whole surface. The passivation film 213 is an insulating film such as a silicon nitride film or the like which is deposited by a plasma CVD method or the like.

According to the second embodiment, the high resistance layer 209 functions as a load resistor element of an SRAM. The high resistance layer 209 is perfectly sealed by the first silicon nitride film 208 and second silicon nitride film 210.

The first silicon nitride film 208 and the second silicon nitride film 210 prevent the impurity ions from being diffused from the film such as a BPSG film 207 to be flattened into the high resistance portion 110 so that the resistance value of the high resistance layer 209 is fluctuated. The silicon nitride film functions as a barrier against a hydrogen ion or atom entering the high resistance layer 209 and restrains fluctuation of the resistance value of the high resistance layer.

As mentioned above, a fine multilayer wiring layer is indispensable to form the semiconductor device. It is strongly required to flatten or smooth the interlayer insulating film between the wiring layers, and various insulating materials have been used for an interlayer insulating film. When the interlayer insulating film is deposited on the wiring layer by the plasma CVD method, it is necessary to form the interlayer insulating film by a high density plasma CVD method for the purpose of reduction of the process time.

In consideration of the above circumstances, according to the first conventional example of the manufacturing method of a semiconductor device, the surface of the high resistance portion 110 is covered by the thermally oxidized silicon film 105 and the $Si_3N_4$ film 106a is formed on the film 105. Therefore, change of the resistance value of the high resistance portion 110 after the interlayer insulating film is deposited by the high density plasma CVD method cannot be avoided. The change or fluctuation of the resistance value is caused by hydrogen atoms or hydrogen ions generated by the high density plasma CVD method and passing through the thermally oxidized silicon film 105 into the high resistance portion 110.

In case of the first conventional example, it has been confirmed in an examination by the inventor that a quantity of hydrogen atoms or ions contained in the high resistance portion 110 increases from $6 \times 10^{18}$ atoms/cc to $1 \times 10^{19}$ atoms/cc when the interlayer insulating film is deposited by the high density plasma CVD method.

In the second conventional example, the surface of the high resistance layer 209 is covered by the silicon nitride film which is deposited by the CVD method. Therefore, a large amount of uncontrollable interfacial energy levels are formed at the interface between the high resistance layer and the silicon nitride film. Such interfacial energy levels change a conductivity of the surface of the high resistance layer to increase the resistance value variation of the high resistance layer built in the semiconductor device such as an SRAM. A manufacturing yield of the semiconductor device decreases.

The problems as mentioned above are more typical when a high density and high performance of semiconductor device is realized.

SUMMARY OF THE INVENTION

It is an object of the invention to provide a semiconductor device with high performance and high reliability and a manufacturing method for the same, in which a resistance value fluctuation of a high resistance layer built in the semiconductor device can be perfectly prevented.

In order to achieve an aspect of the present invention, a method of manufacturing a semiconductor device, includes the steps of:

forming an insulating film on a semiconductor substrate;

forming a semiconductor film pattern on the insulating film; and performing direct thermal nitriding to at least a portion of the semiconductor film pattern.

The performing step of direct thermal nitriding includes forming a protection film to cover the semiconductor film pattern, forming an opening such that the at least a portion of the semiconductor film pattern is exposed, performing lamp annealing in a gas composed of nitrogen. The temperature of the lamp annealing is equal to or higher than 850° C.

Also, the performing step includes performing the direct thermal nitriding to the at least a portion of the semiconductor film pattern such that a direct thermal nitriding film is formed to have a film thickness equal to or thicker than 1.5 nm.

In the method, an interlayer insulating film is formed by a chemical vapor deposition method using a microwave plasma after the performing step to cover the semiconductor film pattern. In this case, the interlayer insulating film is composed of silicon oxide, silicon oxynitride, silicon nitride or silicon oxyfluoride.

The semiconductor device is a static random access memory including a metal-oxide-semiconductor (MOS) transistor, and the MOS transistor is formed on the semiconductor substrate. A conductive connection is formed between a source or drain of the MOS transistor and one end of the semiconductor film pattern.

In order to achieve another aspect of the present invention, a semiconductor device, includes an insulating film formed on a semiconductor substrate, a semiconductor film pattern composed of a main portion and end portions formed on the insulating film, the end portions having lower resistance than the main portion, and a preventing film formed on at least a part of a surface of the semiconductor film pattern with almost no interfacial energy level, for preventing a hydrogen atom or ion from invading into the semiconductor film pattern.

In this case, the preventing film is a thermally nitrided film, and has a film thickness equal to or thicker than 1.5 nm.

The semiconductor device may further include a protection insulating film formed on the insulating film and the preventing film and having an opening corresponding to the at least a part of the surface, a first interlayer insulating film formed on the protection insulating film and the preventing film, and a second interlayer insulating film formed on the first interlayer insulating film. In this case, the second interlayer insulating film may be formed by a microwave plasma CVD method and comprise of silicon oxide, silicon oxynitride, silicon nitride or silicon oxyfluoride.

In order to achieve still another aspect of the present invention, a method of manufacturing a semiconductor device, includes the steps of:

forming an insulating film on a semiconductor substrate;

forming a semiconductor film pattern on the insulating film;

forming a protection film on the insulating film and the semiconductor film pattern;

forming an opening the protection film to expose at least a part of a surface of the semiconductor film pattern; and forming a thermally nitrided film in the exposed part of the semiconductor film pattern.

DESCRIPTION OF THE PREFERRED EMBODIMENTS

A semiconductor device of the present invention will be described below in detail with reference the accompanying drawings.

Figure 1A:
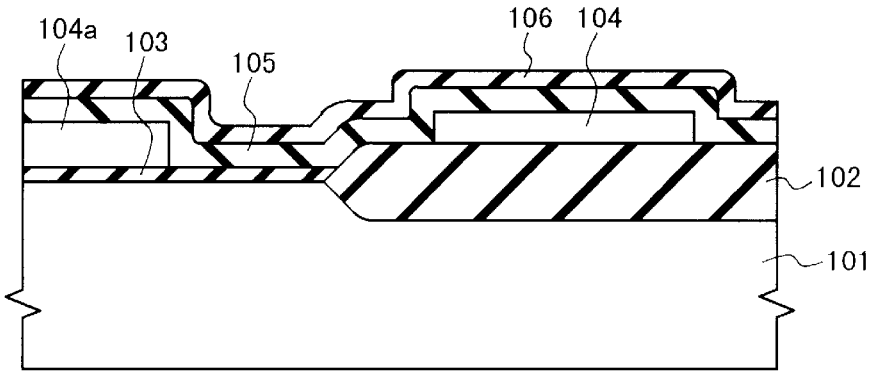
FIGS. 1A to 1E are cross sectional views of a semiconductor device in an order of manufacturing processes in a first conventional example of a manufacturing method of the semiconductor device.
Figure 1B:
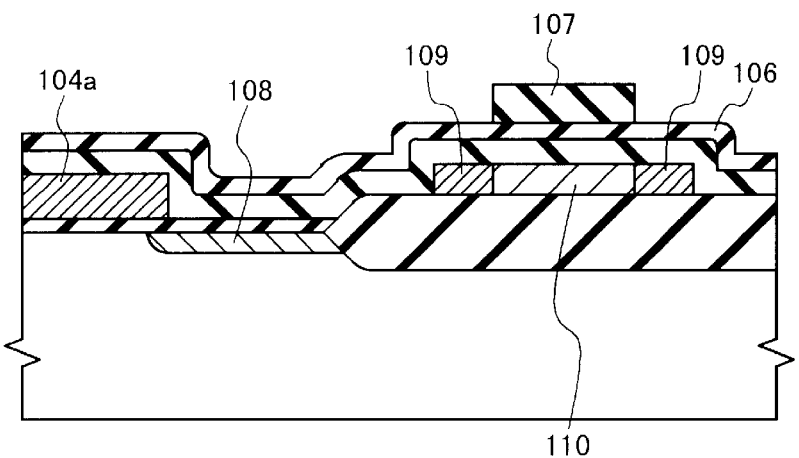
Figure 1C:
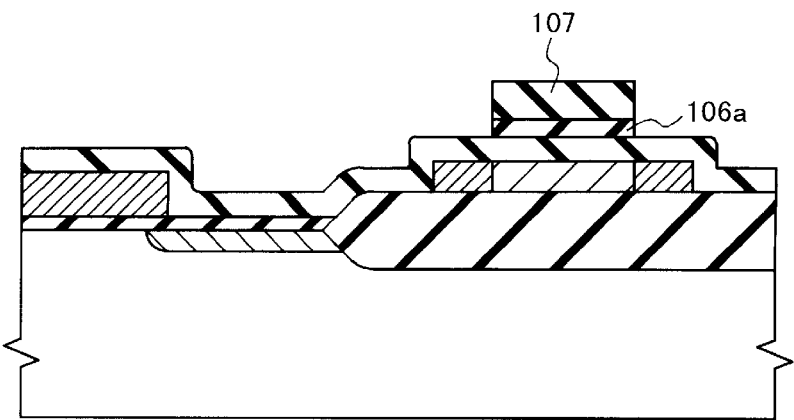
Figure 1D:
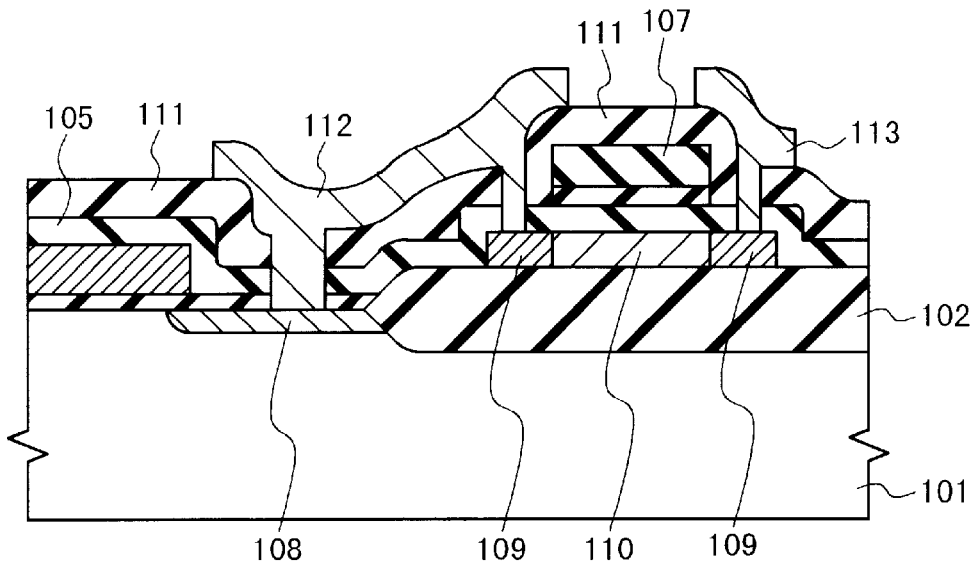
Figure 1E:
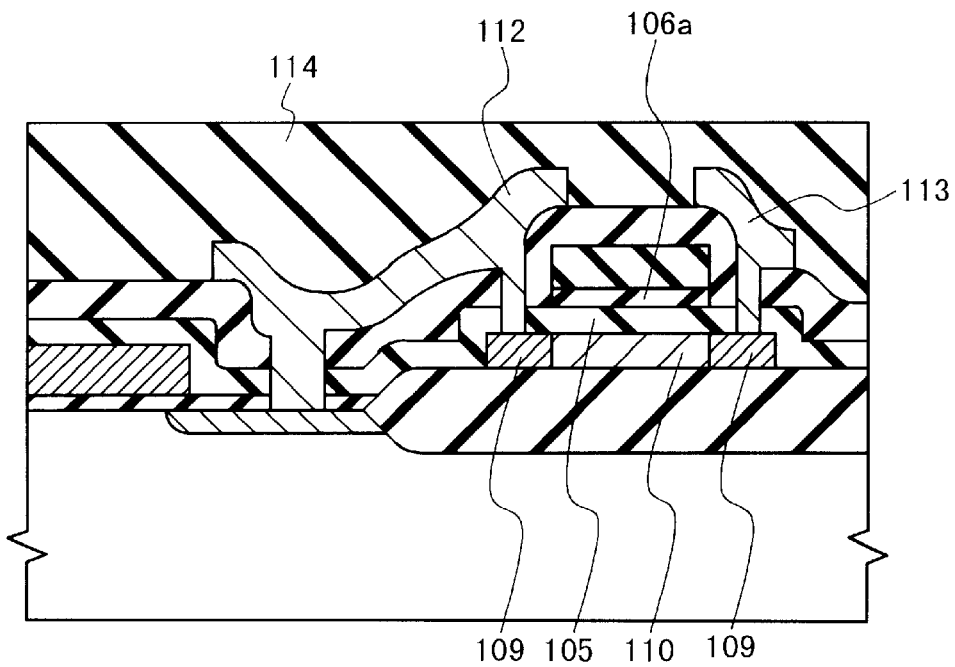
Figure 2A:
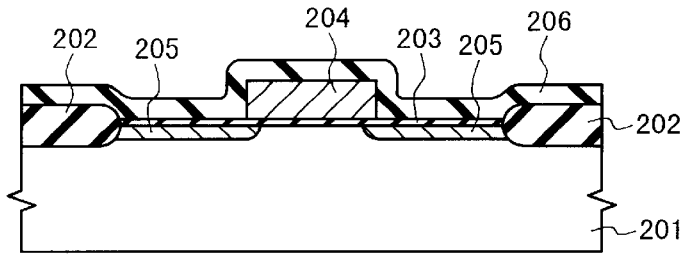
FIGS. 2A to 2D are cross sectional views of a semiconductor device in an order of manufacturing processes in a second conventional example of a manufacturing method of the semiconductor device.
Figure 2B:
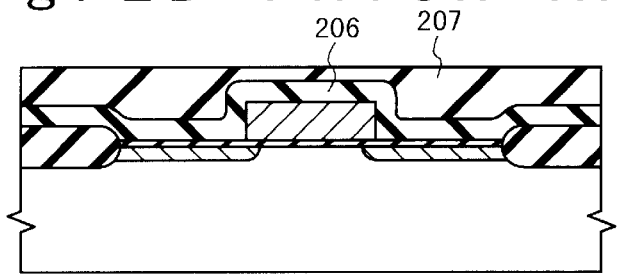
Figure 2C:
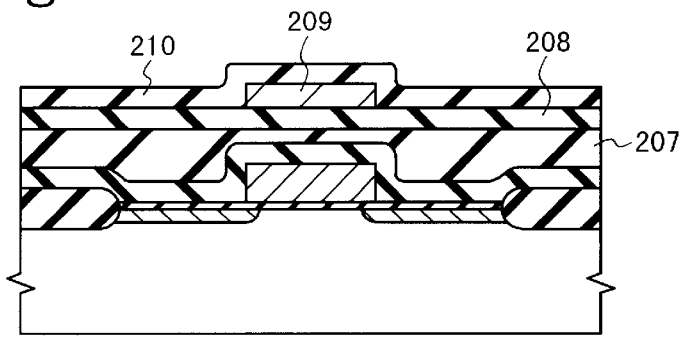
Figure 2D:
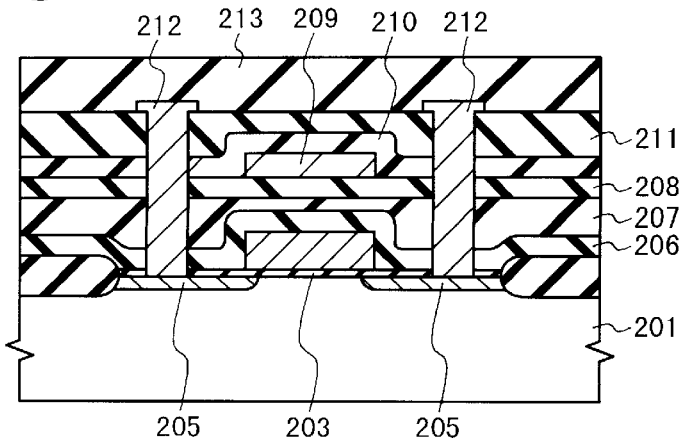
Figure 3:
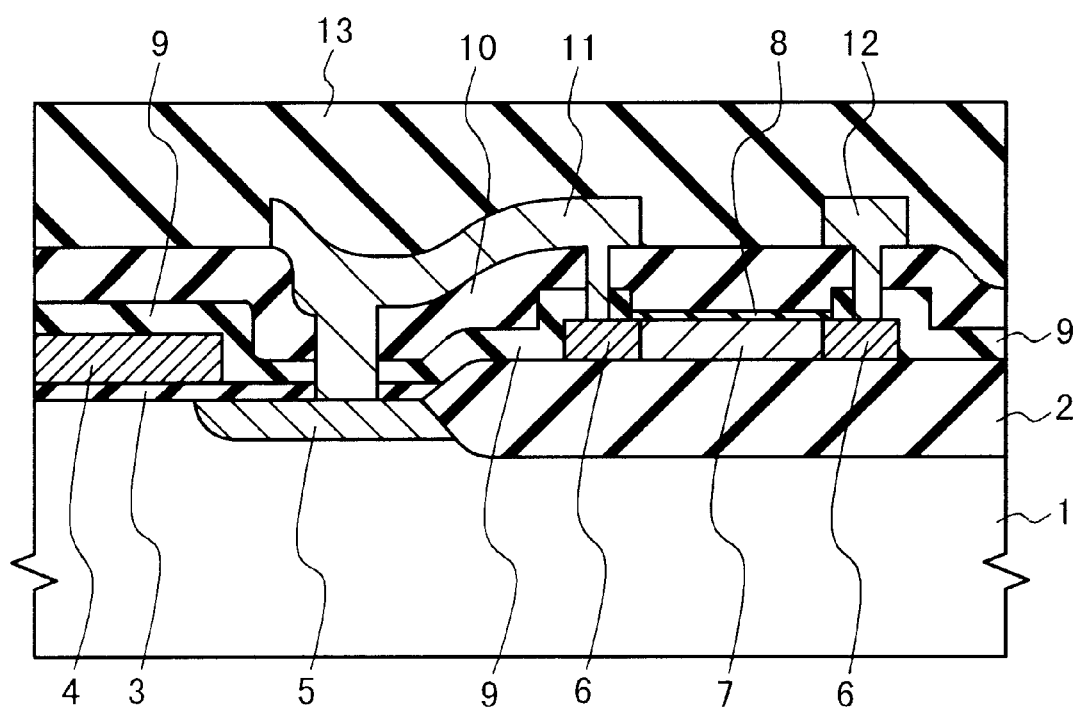
FIG. 3 is a cross sectional view of a semiconductor device according to a first embodiment of the present invention.

FIG. 3 is a cross sectional view of the semiconductor device according to the first embodiment of the present invention, in which a high resistance layer is formed without a resistance value fluctuation.

Referring to FIG. 3, a field oxide film 2 and a gate oxide film 3 are formed in predetermined regions on a silicon substrate 1. A gate electrode 4 is formed on a part of the gate oxide film 3. Source and drain diffusion layers 5 are formed in predetermined regions in the surface of the silicon substrate 1.

A high resistance layer is formed on the field oxide film 2. The high resistance layer is composed of resistance electrode portions 6 and a high resistance portion 7. Further, a directly thermally nitrided film 8 is formed on the surface of the high resistance portion 7.

A protection insulating film 9 having a thin film thickness is formed to cover the gate electrode 4, the resistance electrode portions 6, and the like. Further, a first interlayer insulating film 10 is formed to cover the protection insulating film 9 and the directly thermally nitrided film 8.

Further, a contact hole is formed through the gate oxide film 3, the protection insulating film 9, and the first interlayer insulating film 10 which are laminated on the source and drain diffusion layers 5. A Contact hole is also formed through the protection insulating film 9 and the first interlayer insulating film 10 on the resistance electrode portion 6 of the high resistance layer. The source/drain diffusion layer 5 and one of the resistance electrode portions 6 of the high resistance layer are connected by a wiring 11. The other resistance electrode portion 6 of the high resistance layer is connected to another wiring 12.

A second interlayer insulating film 13 is formed and flattened to cover the whole surface of the first interlayer insulating film 10, the wirings 11 and 12, and the like.

As mentioned above, an MOS transistor is formed on the surface of the silicon substrate 1 and the high resistance layer having the resistance electrode portions 6 and high resistance portion 7 is formed on the field oxide film 2. The high resistance layer can be used as a load resistor element of a high performance SRAM.

Figure 4A:
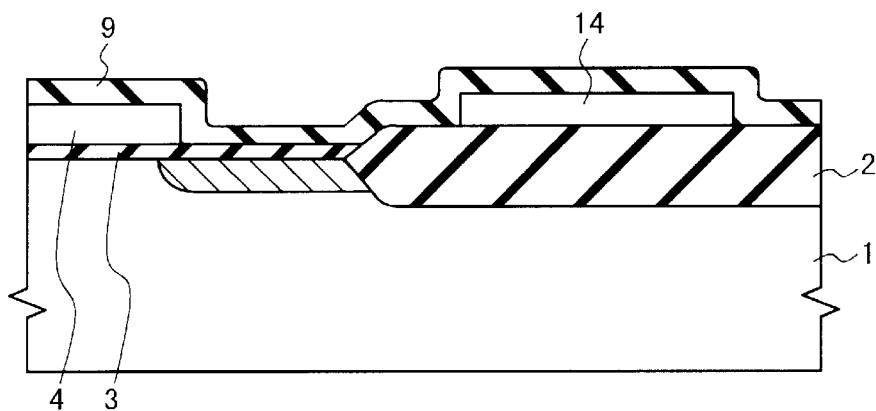
FIGS. 4A to 4C are cross sectional views of the semiconductor device according to the first embodiment of the present invention in an order of manufacturing processes.
Figure 4B:
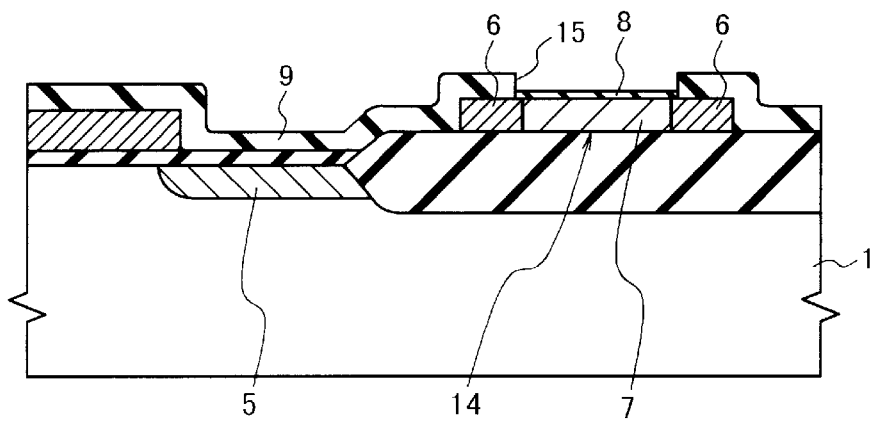
Figure 4C:
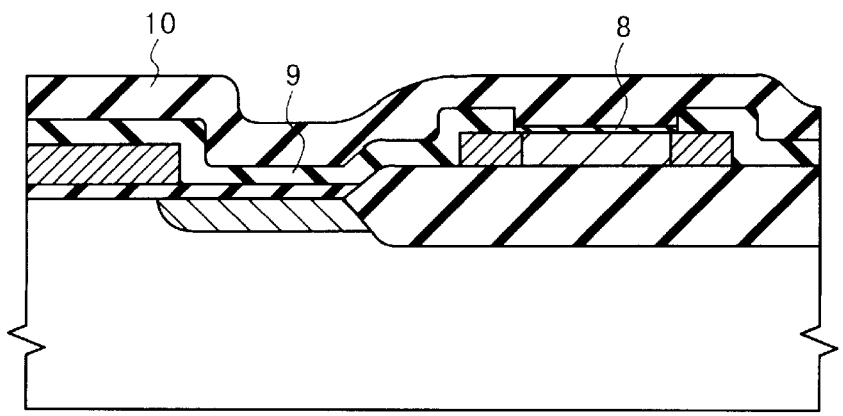

Next, a method of manufacturing the semiconductor device of the invention will now be described with reference to FIGS. 4A to 4C. FIGS. 4A to 4C are cross sectional views of the semiconductor device according to the present invention in an order of main manufacturing processes.

As shown in FIG. 4A, for example, the field oxide film 2 is selectively formed on the surface of the silicon substrate 1 having a P conductivity type. The field oxide film 2 is a silicon oxide film having the film thickness of about 400 nm and formed by a LOCOS (Local Oxidation of Silicon) method or the like. Similarly, the surface of the silicon substrate 1 is thermally oxidized to form the gate oxide film 3 having the film thickness of about 10 nm.

Subsequently, the gate electrode 4 is formed in a predetermined region of the gate oxide film 3. The gate electrode 4 is formed of a polycide film made of a refractory metal such as a tungsten polycide film or the like.

Subsequently, a semiconductor thin film layer 14 having a predetermined shape is formed on the field oxide film 2. The semiconductor thin film layer 14 is made of polysilicon and has the film thickness of about 100 nm. Impurity ions of phosphorus, arsenic, boron, oxygen, or the like have been injected in such a polysilicon film.

Subsequently, the protection insulating film 9 is deposited by the CVD method to cover the gate electrode 4 and the semiconductor thin film layer 14. The protection insulating film 9 is a silicon oxide film having the film thickness of about 100 nm.

Next, as shown in FIG. 4B, the source and drain diffusion layers 5 are formed in a predetermined region in the surface of the silicon substrate 1. At the same time, the resistance electrode portions 6 are formed in end portions of the semiconductor thin film layer 14. That is, a resist mask formed by the photolithography technique is used as an ion implantation mask, and ions are implanted into a predetermined region. Then, thermal treatment is performed. Thus, phosphoric ions are implanted into the source and drain diffusion layers 5, the resistance electrode portions 6 and the gate electrode 4 with a high concentration. As mentioned above, the resistance electrode portions 6 and high resistance portion 7 are formed in the semiconductor thin film layer 14.

A predetermined region of the protection insulating film 9 is removed or etched by the photolithography technique and a dry etching technique. A window opening portion 15 is formed to expose the surface of the high resistance portion 7 at least.

Subsequently, a lamp annealing is executed in the $NH_3$ gas atmosphere. An annealing temperature is set to a temperature higher than 850° C. (in this case, about 900° C.) and a processing time is set to about one minute. The directly thermally nitrided film 8 having the film thickness of about 2 nm is formed on the exposed surface of the high resistance portion 7 by the lamp annealing (hereinafter, to be referred to as an RTN process). Gases such as $N_2H_2$ may be also used in place of $NH_3$.

Next, as shown in FIG. 4C, the first interlayer insulating film 10 is formed to cover the protection insulating film 9 and the directly thermally nitrided film 8. The first interlayer insulating film 10 is formed of a BPSG film (silicon oxide film containing boron glass and phosphorus glass) having the film thickness of about 500 nm.

After that, contact holes, wirings, and the like are formed by a well-known method as described in FIGS. 3. Then, the second interlayer insulating film 13 is formed. The second interlayer insulating film 13 is a silicon oxide film which is deposited by a bias ECR-CVD method and flattened by a chemical mechanical polishing (CMP) method. The bias ECR-CVD is a film forming method in which a film is formed by a chemical vapor deposition by microwave plasma using an electron cyclotron resonance. Such plasma has a fairly higher plasma density as compared with that of ordinary high frequency plasma.

In the formation of the second interlayer insulating film 13, a reaction gas of a helicon wave plasma or a high density plasma generated by an inductively coupled plasma or the like may be used. As the second interlayer insulating film 13, any one of a silicon oxynitride film, a silicon nitride film, and a silicon oxyfluoride insulating film other than the silicon oxide film may be also formed.

As mentioned above, according to the manufacturing method of the present invention, a quantity of hydrogen atoms or ions contained in the high resistance portion 7 never changes after completion of the manufacturing process of the semiconductor device. According to the actual measurement, the quantity of hydrogen atoms or ions is held at $6 \times 10^{18}$ to $7 \times 10^{18}$ atoms/cc and does not entirely change.

Figure 5:
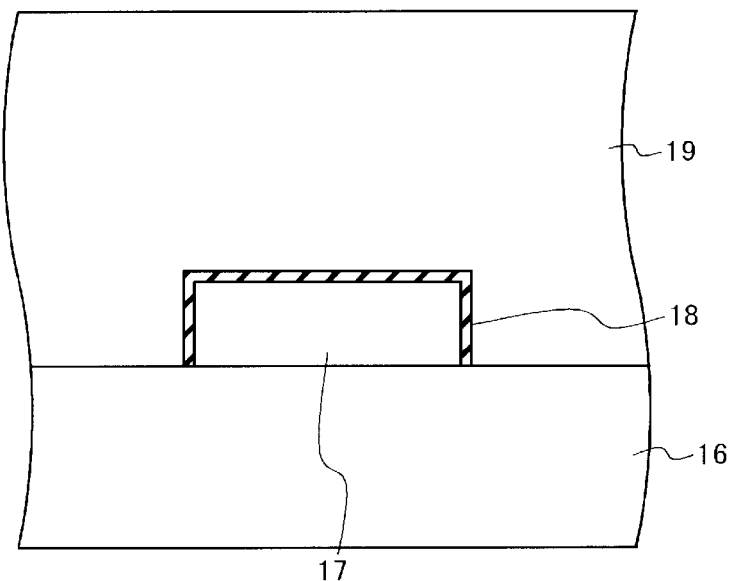
FIG. 5 is a schematic cross sectional view of a high resistance film in the semiconductor device according to the first embodiment of the present invention.

Effects of the invention will now be described with reference to FIGS. 5 and 6. FIG. 5 is a cross sectional view schematically showing a cross sectional view of the high resistance portion 7 of a vertical sectional view shown in FIG. 3. A high resistance portion 17 of the high resistance layer is formed on a lower insulating film 16. The surface of the high resistance portion 17 is directly thermally nitrided to form a silicon nitride film having a thin film thickness. That is, a peripheral region of the high resistance portion 17 is completely covered by the direct thermal nitride film 18.

According to the invention, an upper insulating film 19 is formed on the high resistance portion 17 covered by such a direct thermal nitride film 18. In the direct thermal nitride film of the invention, a film density increases larger than that of the silicon nitride film deposited by the CVD method. Therefore, even if the upper insulating film 19 is deposited by the CVD method using the high density plasma so that a great quantity of hydrogen atoms or hydrogen ions are formed, the hydrogen atoms or hydrogen ions are perfectly shut off from the high resistance portion 17, as mentioned above.

Also, interfacial energy levels are hardly formed at the interface between the direct thermal nitride film 18 and high resistance portion 17. Therefore, the resistance value fluctuation due to the interfacial energy levels as described in the second conventional example never occurs.

Figure 6:
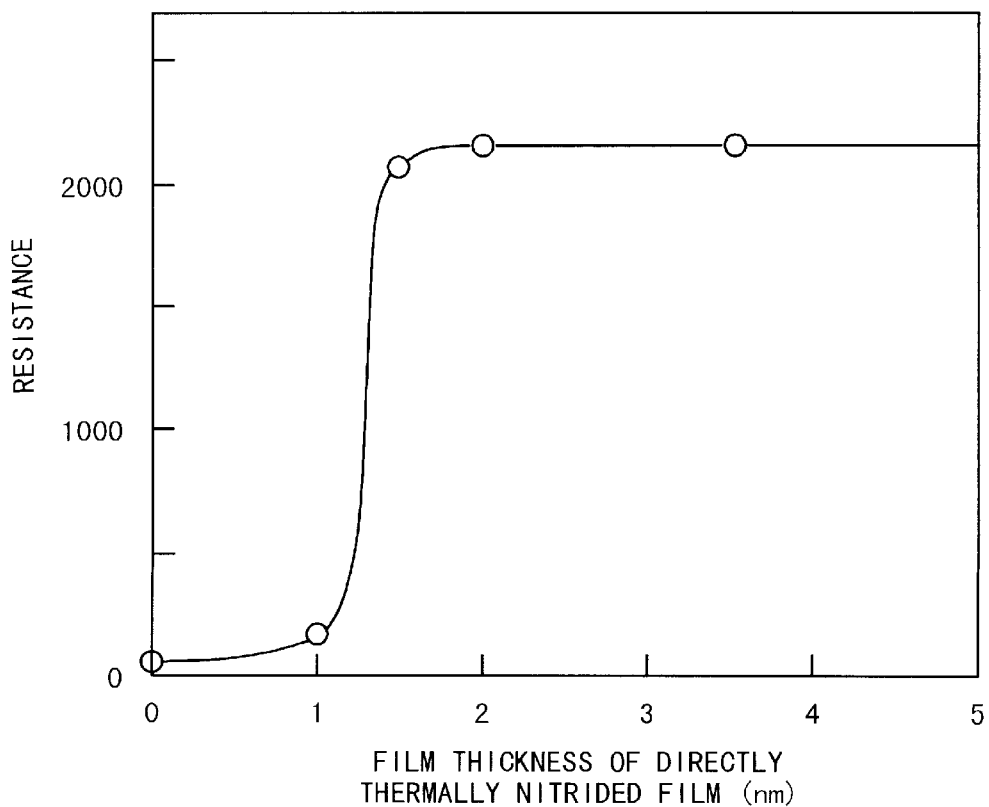
FIG. 6 is a graph illustrating a relation of resistance to the film thickness of a directly thermally nitrided film.

FIG. 6 is a graph showing the relation between the film thickness of the direct thermal nitride film and the resistance value of the high resistance layer. The resistance value is shown by an arbitrary unit and indicates a value after the upper insulating film is formed by the high density plasma.

As shown in FIG. 6, if the thickness of the direct thermal nitride film on the surface of the high resistance portion is equal to or larger than 1.5 nm, there is no resistance value fluctuation and the resistance value is equal to about 2100. When the film thickness is equal to about 1 nm, the resistance value remarkably decreases to about 150. It could be understood that the direct thermal nitride film of the present invention is formed on the surface of the high resistance portion and is fairly effective when the film thickness of direct thermal nitride film is equal to or larger than 1.5 nm.

The above description has been given with respect to the case where the high resistance layer is used as a load resistor element of the SRAM. However, the present invention is not limited to the case where it is applied to such a high resistance layer. Even if the present invention is applied to a protection resistor element or a resistor element which is used in a logic device, a similar effect will be derived. In those cases, a resistance value of the resistor element is relatively low. For instance, the concentration of impurity such as phosphorus, arsenic, boron, or the like contained in the resistor element is equal to $10^{16}$ to $10^{17}$ atoms/cc.

As described above, according to the present invention, the direct thermal nitride film is formed on the surface of the high resistance portion of the high resistance layer. Therefore, even if the interlayer insulating film is deposited by the high density plasma CVD method to be formed above the high resistance layer, the resistance value fluctuation of the high resistance portion because of hydrogen atoms or hydrogen ions never occurs.

The interfacial energy levels are hardly formed at the interface between the direct thermal nitride film and the high resistance portion. Therefore, increase in resistance value variation of the high resistance layer and deterioration of the reliability as seen in the conventional examples never occur. The manufacturing yield of the semiconductor device is remarkably improved.

In this manner, the high density and high performance of semiconductor device having the high resistance layer can be easily realized in the present invention.

What is claimed is:

1. A semiconductor device, comprising:
   an insulating film formed on a semiconductor substrate;
   a semiconductor film pattern composed of a main portion and end portions formed on said insulating film, said end portions having lower resistance than said main portion; and
   a preventing film formed on at least part of a surface of said semiconductor film pattern with almost no interfacial energy level for preventing a hydrogen atom or ion from invading into the semiconductor film pattern, wherein said preventing film is a thermally nitrided film.

2. A semiconductor device, comprising:
   an insulating film formed on a semiconductor substrate;
   a semiconductor film pattern composed of a main portion and end portions formed on said insulating film, said end portions having lower resistance than said main portion; and
   a preventing film formed on at least part of a surface of said semiconductor film pattern with almost no interfacial energy level for preventing a hydrogen atom or ion from invading into the semiconductor film pattern, wherein said preventing film has a film thickness equal to or thicker than 1.5 nm.

3. A semiconductor device, comprising:
   an insulating film formed on a semiconductor substrate;
   a semiconductor film pattern composed of a main portion and end portions formed on said insulating film, said end portions having lower resistance than said main portion;
   a preventing film formed on at least part of a surface of said semiconductor film pattern with almost no interfacial energy level for preventing a hydrogen atom or ion from invading into the semiconductor film pattern;
   a protection insulating film formed on said insulating film and said preventing film and having an opening corresponding to said at least a part of said surface;
   a first interlayer insulating film formed on said protection insulating film and said preventing film; and a second interlayer insulating film formed on said first interlayer insulating film.

4. A semiconductor device according to claim 3, wherein said second interlayer insulating film is formed by a microwave plasma CVD method and comprises of silicon oxide, silicon oxynitride, silicon nitride or silicon oxyfluoride.

5. A semiconductor device according to claim 3, wherein said semiconductor device is an SRAM, and wherein semiconductor device further includes:
- a MOS transistor formed on said semiconductor substrate; and
- a wiring pattern for conductively connecting between a source or drain of said MOS transistor and one of said end portions of said semiconductor film pattern.

* * * * *